US012777641B2

(12) United States Patent
Kim

(10) Patent No.: US 12,777,641 B2
(45) Date of Patent: Oct. 27, 2026

(54) SEMICONDUCTOR DEVICE HAVING DISCHARGE CONTACT STRUCTURE AND METHOD OF MANUFACTURING THE SAME

(71) Applicant: SK hynix Inc., Icheon-si (KR)

(72) Inventor: Jae Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 722 days.

(21) Appl. No.: 18/076,809

(22) Filed: Dec. 7, 2022

(65) Prior Publication Data

US 2024/0023329 A1 Jan. 18, 2024

(30) Foreign Application Priority Data

Jul. 15, 2022 (KR) ........................ 10-2022-0087245

(51) Int. Cl.

| | |
|---|---|
| ***H10B 43/27*** | (2023.01) |
| ***H10B 41/10*** | (2023.01) |
| ***H10B 41/27*** | (2023.01) |
| ***H10B 41/40*** | (2023.01) |
| ***H10B 41/50*** | (2023.01) |
| ***H10B 43/10*** | (2023.01) |
| ***H10B 43/40*** | (2023.01) |
| ***H10B 43/50*** | (2023.01) |
| ***H10W 20/00*** | (2026.01) |
| ***H10W 20/41*** | (2026.01) |
| ***H10W 42/60*** | (2026.01) |

(52) U.S. Cl.

CPC ............. *H10B 43/27* (2023.02); *H10B 41/10* (2023.02); *H10B 41/27* (2023.02); *H10B 41/40* (2023.02); *H10B 41/50* (2023.02); *H10B 43/10* (2023.02); *H10B 43/40* (2023.02); *H10B 43/50* (2023.02); *H10W 20/054* (2026.01); *H10W 20/435* (2026.01); *H10W 42/60* (2026.01)

(58) Field of Classification Search

CPC .......... H10B 41/00–41/70; H10B 43/00–43/50

See application file for complete search history.

(56) References Cited

U.S. PATENT DOCUMENTS

| | | | |
|---|---|---|---|
| 10,756,105 B2 | 8/2020 | Fukuzumi et al. | |
| 2020/0203370 A1 | 6/2020 | Son et al. | |
| 2020/0373321 A1* | 11/2020 | Kwak | H10B 43/40 |
| 2020/0381447 A1 | 12/2020 | Kim et al. | |
| 2021/0134821 A1 | 5/2021 | Choi | |

(Continued)

FOREIGN PATENT DOCUMENTS

KR 1020210025032 A 3/2021

*Primary Examiner* — Kevin Parendo

(74) *Attorney, Agent, or Firm* — WILLIAM PARK AND ASSOCIATES LTD.

(57) ABSTRACT

A semiconductor device, and a method for manufacturing the semiconductor device, includes a discharge interconnection structure and a source structure on the discharge interconnection structure. The semiconductor device also includes a first discharge contact structure extending through the source structure to be electrically connected to the discharge interconnection structure, the first discharge contact structure having a first depth. The semiconductor device further includes a second discharge contact structure positioned in the source structure, the second discharge contact structure having a second depth different from the first depth.

23 Claims, 18 Drawing Sheets

(56) References Cited

U.S. PATENT DOCUMENTS

| | | | | |
|---|---|---|---|---|
| 2021/0210425 | A1* | 7/2021 | Lee | H01L 23/481 |
| 2022/0216197 | A1 | 7/2022 | Nam | |
| 2022/0310808 | A1* | 9/2022 | Kajino | H10D 30/6892 |
| 2023/0061128 | A1* | 3/2023 | Yang | H10B 43/50 |

* cited by examiner

SEMICONDUCTOR DEVICE HAVING DISCHARGE CONTACT STRUCTURE AND METHOD OF MANUFACTURING THE SAME

CROSS-REFERENCE TO RELATED APPLICATION

This application claims priority under 35 U.S.C. § 119 to Korean Patent Application No. 10-2022-0087245, filed on Jul. 15, 2022, in the Korean Intellectual Property Office, the disclosure of which is incorporated herein by reference in its entirety.

BACKGROUND

1. Technical Field

Various embodiments of the present disclosure relate to an electronic device and a manufacturing method thereof, and more particularly, to a semiconductor device and a manufacturing method thereof.

2. Related Art

The degree of integration of a semiconductor device is mainly determined by an area occupied by unit memory cells. Recently, as the improvement in the degree of integration of a semiconductor device for forming memory cells as a single layer on a substrate has reached its limit, a three-dimensional semiconductor device for stacking memory cells on a substrate has been proposed. In addition, various structures and manufacturing methods are being developed to improve operational reliability of such a three-dimensional semiconductor device.

SUMMARY

In accordance with an embodiment of the present disclosure, a semiconductor device may include: a discharge interconnection structure; a source structure on the discharge interconnection structure; a first discharge contact structure extending through the source structure to be electrically connected to the discharge interconnection structure, the first discharge contact structure having a first depth; and a second discharge contact structure positioned in the source structure, the second discharge contact structure having a second depth different from the first depth.

In accordance with an embodiment of the present disclosure, a semiconductor device may include: a source structure including a cell region and a dummy region; a gate structure positioned on the cell region of the source structure; a dummy stack positioned on the dummy region of the source structure; a first contact structure positioned in the dummy region of the source structure, the first contact structure having a first depth; and a second contact structure positioned in the dummy region of the source structure, the second contact structure having a second depth smaller than the first depth, and the second contact structure being electrically connected to the first contact structure through the source structure.

In accordance with an embodiment of the present disclosure, a manufacturing method of a semiconductor device may include: forming a source structure; forming a first discharge contact structure extending through the source structure, and having a first depth; forming a second discharge contact structure positioned in the source structure and having a second depth different from the first depth; and forming a dummy stack on the source structure.

In accordance with an embodiment of the present disclosure, a manufacturing method of a semiconductor device may include: forming a source structure including a cell region and a dummy region; forming a landing pad in the cell region of the source structure; forming a first contact structure positioned in the dummy region of the source structure, and having a first depth; and forming a second contact structure positioned in the dummy region of the source structure and having a second depth smaller than the first depth.

DETAILED DESCRIPTION

Various embodiments according to the technical spirit of the present disclosure are described below with reference to the accompanying drawings.

Figure 1A:
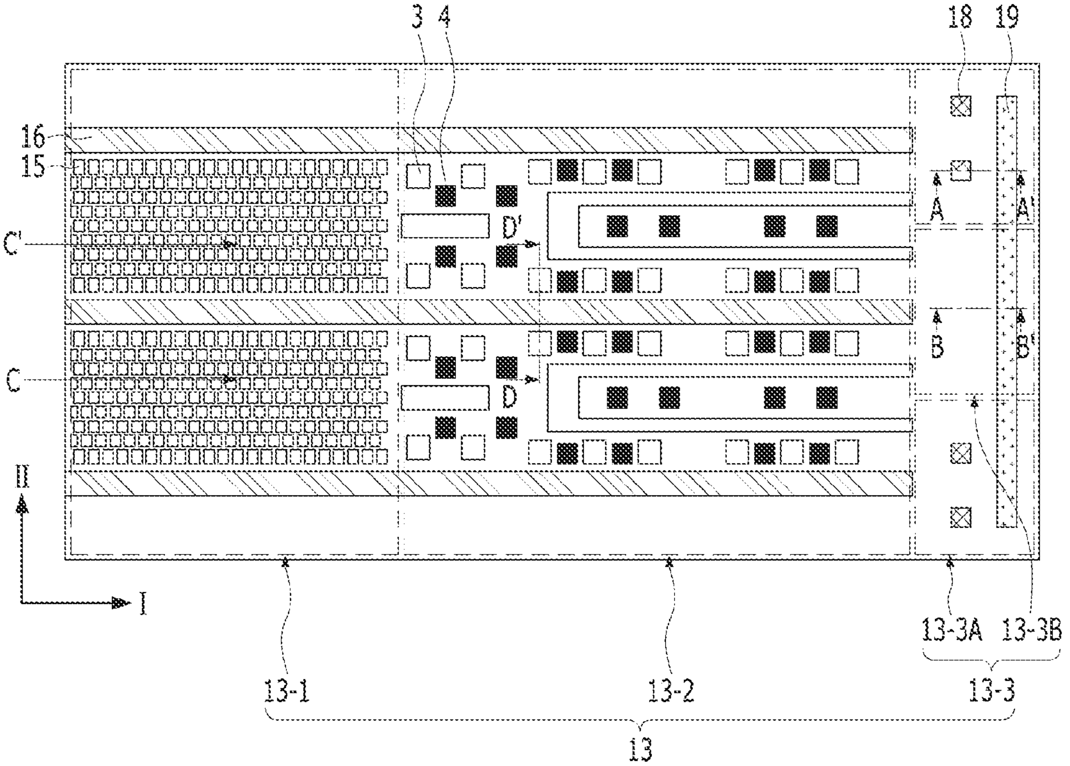
FIGS. 1A to 1E are diagrams illustrating a structure of a semiconductor device in accordance with an embodiment of the present disclosure.

FIGS. 1A to 1E are diagrams illustrating a structure of a semiconductor device in accordance with an embodiment. FIG. 1A may be a plan view illustrating the semiconductor device, FIG. 1B may be a cross-sectional view illustrating the semiconductor device taken along an A-A' line of FIG. 1A, FIG. 1C may be a cross-sectional view illustrating the semiconductor device taken along a B-B' line of FIG. 1A, FIG. 1D may be a cross-sectional view illustrating the semiconductor device taken along a C-C' line of FIG. 1A, and FIG. 1E may be a cross-sectional view illustrating the semiconductor device taken along a D-D' line of FIG. 1A.

Figure 1B:
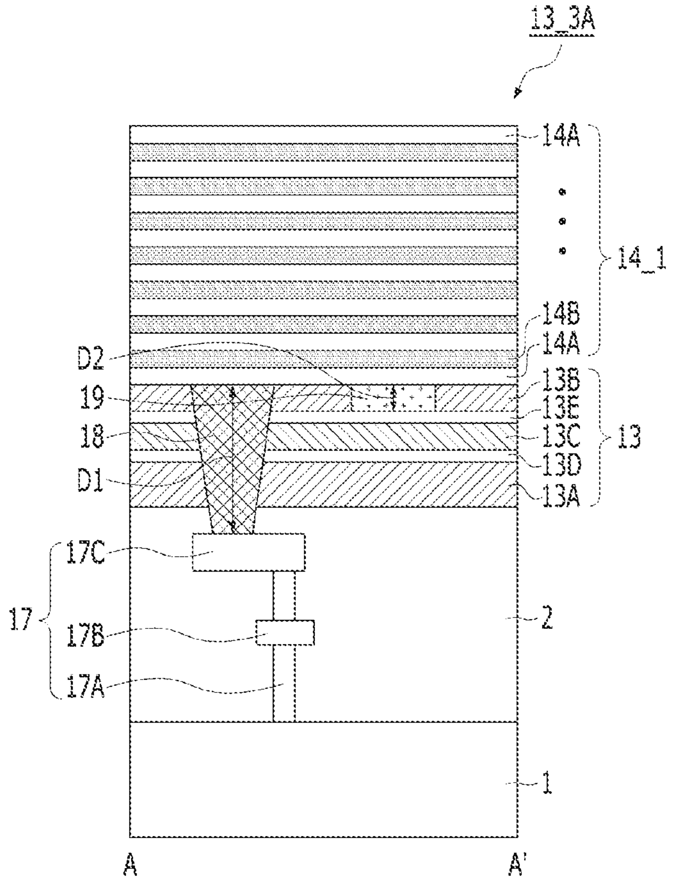

Referring to FIGS. 1A and 1B, the semiconductor device may include a source structure 13, a first contact structure 18, a second contact structure 19, or combinations thereof. The semiconductor device may further include a substrate 1, a discharge interconnection structure 17, an inter-layer dielectric layer 2, a dummy stack 14_1, or combinations thereof.

The source structure 13 may include a cell region 13_1, a connection region 13_2, a dummy region 13_3, or combinations thereof. The dummy region 13_3 may be positioned adjacent to the cell region 13_1 in a first direction I. The connection region 13_2 may be positioned between the cell region 13_1 and the dummy region 13_3, and the cell region 13_1 and the dummy region 13_3 may be connected to each other by the connection region 13_2. The dummy region 13_3 may include a first dummy region 13_3A in which the first contact structure 18 is positioned and a second dummy region 13_3B in which the second contact structure 19 is positioned. The first dummy region 13_3A and the second dummy region 13_3B may be adjacent to each other in a second direction II. For example, the second dummy region 13_3B may be positioned between the first dummy regions 13_3A.

The dummy region 13_3 of the source structure 13 may include a first source layer 13A, a second source layer 13B, a source sacrificial layer 13C, or combinations thereof. The source structure 13 may further include a first passivation layer 13D, a second passivation layer 13E, or a combination thereof. The source sacrificial layer 13C may be positioned between the first source layer 13A and the second source layer 13B. The first passivation layer 13D may be positioned between the first source layer 13A and the source sacrificial layer 13C. The second passivation layer 13E may be positioned between the source sacrificial layer 13C and the second source layer 13B. The source structure 13 may include a conductive material such as polysilicon or metal. The first passivation layer 13D or the second passivation layer 13E may include an insulating material such as an oxide or a nitride.

The dummy stack 14_1 may be positioned on the dummy region 13_3 of the source structure 13. For example, the dummy stack 14_1 may be positioned on the first dummy region 13_3A of the source structure 13 and may extend to the second dummy region 13_3B. The dummy stack 14_1 may include insulating layers 14A or sacrificial layers 14B. For example, the dummy stack 14_1 may include the insulating layers 14A and the sacrificial layers 14B that are alternately stacked on one another.

The first contact structure 18 may be for discharging charges accumulated in the source structure 13 during a manufacturing process. For example, the first contact structure 18 may be a discharge contact structure. The first contact structure 18 may be positioned in the dummy region 13_3 of the source structure 13. For example, the first contact structure 18 may be positioned in the first dummy region 13_3A of the source structure 13. The first contact structure 18 may be spaced apart from the second dummy region 13_3B of the source structure 13. The first contact structure 18 might not be positioned in the second dummy region 13_3B.

The first contact structure 18 may have a plug shape. The first contact structure 18 may have a circular shape, an elliptical shape, or a polygonal shape in a plan view. The first contact structure 18 may include a protrusion protruding toward the cell region 13_1 of the source structure 13 or the first contact structure 18. One or more first contact structures 18 may be positioned in the first dummy region 13_3A. A plurality of first contact structures 18 may be spaced apart from one another in the first direction I or the second direction II. The first contact structure 18 may include a material having lower resistivity than the source structure 13. Accordingly, the charges in the source structure 13 may move through the first contact structure 18 having relatively low resistance, which makes it possible to reduce resistance of a charge emission path. For example, the source structure 13 may include polysilicon, and the first contact structure 18 may include a metal material such as tungsten.

The second contact structure 19 may be for discharging charges accumulated in the source structure 13 during a manufacturing process. For example, the second contact structure 19 may be a discharge contact structure. The second contact structure 19 may be positioned in the dummy region 13_3 of the source structure 13. For example, the second contact structure 19 may be positioned in the second dummy region 13_36 of the source structure 13.

The position of the second contact structure 19 may be determined in consideration of the position of the first contact structure 18 and the resistance of the charge emission path. Because the first contact structure 18 is not positioned in the second dummy region 13_36, the charges have to move through the source structure 13 having relatively high resistance when the charges are emitted. Accordingly, as the second contact structure 19 is positioned in the second dummy region 13_36, the charges may move through the second contact structure 19 having relatively low resistance in the second dummy region 13_36, and the resistance of the charge emission path may be reduced. For reference, the second contact structure 19 may be positioned in the first dummy region 13_3A. The second contact structure 19 may extend to the first dummy region 13_3A. For example, the first contact structure 18 and the second contact structure 19 may be positioned in the first dummy region 13_3A, and the second contact structure 19 may be positioned in the second dummy region 13_36.

The second contact structure 19 may have a line shape. The second contact structure 19 may extend in the second direction II or in a diagonal direction intersecting the first direction I and the second direction II. At least a portion of the second contact structure 19 may include a curve or wave. The second contact structure 19 may also include a protrusion protruding toward the cell region 13_1 of the source structure 13 or the first contact structure 18. The second contact structure 19 may include a material having lower resistivity than the source structure 13. The second contact structure 19 may include substantially the same material as or a different material from the first contact structure 18. For example, the source structure 13 may include polysilicon, and the second contact structure 19 may include a metal material such as tungsten.

The first contact structure 18 and the second contact structure 19 may be spaced apart from each other. The first contact structure 18 may be positioned closer to the cell region 13_1 of the source structure 13 than the second contact structure 19. The second contact structure 19 may be electrically connected to the first contact structure 18 through the source structure 13.

The first contact structure 18 and the second contact structure 19 may have different depths. The first contact structure 18 may have a first depth D1. The first contact structure 18 may extend through the source structure 13. For example, the first contact structure 18 may pass through the second source layer 13B, the second passivation layer 13E, the source sacrificial layer 13C, the first passivation layer 13D, and the first source layer 13A from a top surface of the source structure 13.

The second contact structure 19 may have a second depth D2 different from the first depth D1. The second depth D2 may be smaller than the first depth D1. The second contact structure 19 may pass through a portion of the source structure 13 and may be positioned in the source structure 13. For example, the second contact structure 19 may pass through the second source layer 138 from the top surface of the source structure 13.

The source structure 13 may be positioned on the discharge interconnection structure 17. The discharge interconnection structure 17 may be positioned below the dummy region 13_3 of the source structure 13. For example, the discharge interconnection structure 17 may be positioned below the first dummy region 13_3A of the source structure 13. The discharge interconnection structure 17 may be positioned on the substrate 1. The inter-layer dielectric layer 2 may be positioned between the substrate 1 and the source structure 13, and the discharge interconnection structure 17 may be positioned in the inter-layer dielectric layer 2.

The discharge interconnection structure 17 may include contact plugs 17A, a wiring 17B, a connection pad 17C, or combinations thereof. Each of the contact plugs 17A may connect the substrate 1 to the wiring 17B, connect the wiring 17B to the connection pad 17C, or connect the wiring 17B to the wiring 17B. The connection pad 17C may electrically connect the substrate 1 to the first contact structure 18 through the contact plugs 17A or the wiring 17B. The contact plugs 17A, the wiring 17B or the connection pad 17C may include a conductive material such as tungsten.

The discharge interconnection structure 17 may be electrically connected to the first contact structure 18. The first contact structure 18 may be directly connected to the discharge interconnection structure 17. Accordingly, the charge emission path through the first contact structure 18 and the discharge interconnection structure 17 may be provided. The second contact structure 19 may be electrically connected to the discharge interconnection structure 17 through the first contact structure 18. Accordingly, the charge emission path through the second contact structure 19, the first contact structure 18, and the discharge interconnection structure 17 may be provided.

Figure 1C:
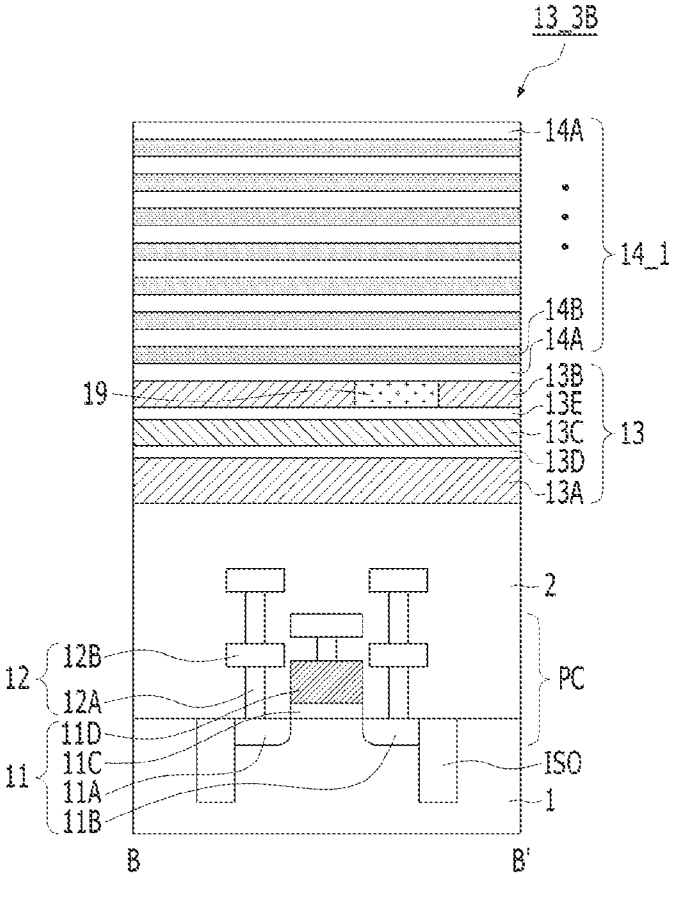

Referring to FIGS. 1A to 1C, the semiconductor device may include the source structure 13, the second contact structure 19, or a combination thereof. The semiconductor device may further include the substrate 1, the inter-layer dielectric layer 2, a peripheral circuit PC, an interconnection structure 12, or combinations thereof.

The peripheral circuit PC may be positioned below the source structure 13. The peripheral circuit PC may be positioned below the dummy region 13_3 of the source structure 13. For example, the peripheral circuit PC may be positioned below the second dummy region 13_3B of the source structure 13. The peripheral circuit PC may be positioned on the substrate 1, an isolation layer ISO may be positioned in the substrate 1, and an active region may be defined by the isolation layer ISO. The peripheral circuit PC may include a transistor 11, a capacitor, and a resistor. For example, the transistor 11 may include a first junction 11A, a second junction 11B, a gate insulating layer 11C, or a gate electrode 11D. The gate insulating layer 11C may be positioned between the gate electrode 11D and the substrate 1. The gate insulating layer 11C and the isolation layer ISO may include an insulating material such as an oxide or a nitride.

The interconnection structure 12 may be positioned below the dummy region 13_3 of the source structure 13. For example, the interconnection structure 12 may be positioned below the second dummy region 13_3B of the source structure 13. The interconnection structure 12 may include contact plugs 12A or wirings 12B. The inter-layer dielectric layer 2 may be positioned between the substrate 1 and the source structure 13, and the interconnection structure 12 may be positioned in the inter-layer dielectric layer 2. The interconnection structure 12 may be electrically connected to the peripheral circuit PC. For example, the interconnection structure 12 may be electrically connected to the transistor 11. Each of the contact plugs 12A may connect the first junction 11A and the second junction 11B of the transistor to the wirings 12B or connect the wirings 12B. In addition, each of the contact plugs 12A may connect the gate electrode 11D to the wirings 12B. The contact plugs 12A or the wirings 12B may include a conductive material such as aluminum, copper, or tungsten.

The first contact structure 18 may be positioned in the dummy region 13_3 of the source structure 13, and the position of the first contact structure 18 may be limited in consideration of the positions of the interconnection structure 12 and the discharge interconnection structure 17. The first contact structure 18 may have a greater depth than the second contact structure 19 and may be directly connected to the discharge interconnection structure 17. Accordingly, the first contact structure 18 may be positioned in the first dummy region 13_3A of the source structure 13 in which the interconnection structure 12 or the peripheral circuit PC is not positioned, in consideration of the space in which the discharge interconnection structure 17 is to be positioned.

The shapes and positions of the first contact structure 18 and the second contact structure 19 may be determined in consideration of the positions of the interconnection structure and the discharge interconnection structure. The first contact structure 18 may be directly connected to the discharge interconnection structure 17 and may be electrically isolated from the interconnection structure 12. Accordingly, the first contact structure 18 may be positioned to overlap the discharge interconnection structure 17 in a stacking direction and may be positioned not to overlap the interconnection structure 12 in the stacking direction. Because the second contact structure 19 is connected to the discharge interconnection structure 17 through the first contact structure 18, the second contact structure 19 may overlap the interconnection structure 12 in the stacking direction. To secure a distance between the second contact structure 19 and the interconnection structure 12, the second contact structure 19 may be positioned in the second dummy region 13_36 to have a smaller depth than the first contact structure 18.

Figure 1D:
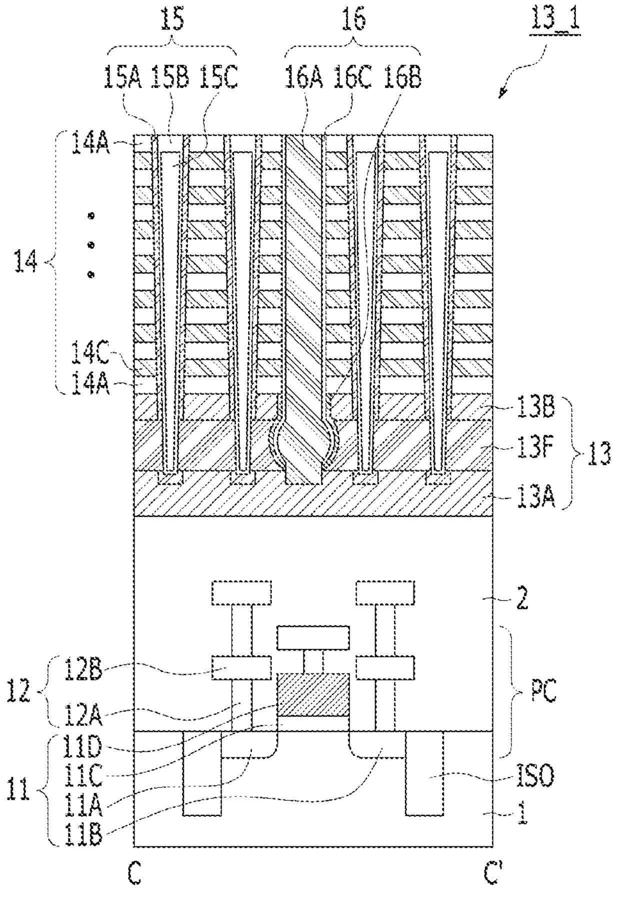

Referring to FIGS. 1A and 1D, the semiconductor device may include the source structure 13, a gate structure 14, channel structures 15, source contact structures 16, or combinations thereof. The semiconductor device may further include the substrate 1, the inter-layer dielectric layer 2, the peripheral circuit PC, the interconnection structure 12, the isolation layer ISO, or combinations thereof.

The cell region 13_1 of the source structure 13 may include a first source layer 13A, a second source layer 13B, a third source layer 13F, or combinations thereof. The third source layer 13F may be positioned between the first source layer 13A and the second source layer 13B. The first source layer 13A of the cell region 13_1 may be positioned at substantially the same level as the first source layer 13A of the dummy region 13_3, and be a single layer connected to the first source layer 13A of the dummy region 13_3. The second source layer 13B of the cell region 13_1 may be positioned at substantially the same level as the second source layer 13B of the dummy region 13_3, and be a single layer connected to the second source layer 13B of the dummy region 13_3. The third source layer 13F of the cell region 13_1 may be positioned at a level corresponding to the first passivation layer 13D, the source sacrificial layer 13C and the second passivation layer 13E of the dummy region 13_3. The source structure 13 may include a conductive material such as polysilicon or metal.

The gate structure 14 may be positioned on the source structure 13. For example, the gate structure 14 may be positioned on the cell region 13_1 of the source structure 13 and may extend to the connection region 13_2. The gate structure 14 may include insulating layers 14A or conductive layers 14C. For example, the gate structure 14 may include the insulating layers 14A and the conductive layers 14C that are alternately stacked on one another. Each of the conductive layers 14C may include a metal material such as tungsten. In addition, each of the conductive layers 14C may be a word line, a drain selection line or a source selection line.

The gate structure 14 may be positioned at substantially the same level as the dummy stack 14_1. The insulating layers 14A of the gate structure 14 and the insulating layers 14A of the dummy stack 14_1 may be positioned at substantially the same level. Each of the insulating layers 14A of the gate structure 14 and each of the insulating layers 14A of the dummy stack 14_1 positioned at a level corresponding to each other may be a single layer connected to each other. The conductive layers 14C of the gate structure 14 and the sacrificial layers 14B of the dummy stack 14_1 may be positioned at substantially the same level. The sacrificial layers 14B may remain without being replaced with the conductive layers 14C during a manufacturing process.

The channel structures 15 may be positioned on the cell region 13_1 of the source structure 13. The channel structures 15 may be arranged in the first direction I and the second direction II intersecting the first direction I. The channel structures 15 may be positioned between the source contact structures 16. Each of the channel structures 15 may extend through the gate structure 14 and may be connected to the cell region 13_1 of the source structure 13. For example, a channel layer 15B may be directly connected to the third source layer 13F or may be connected to the cell region 13_1 of the source structure 13 through an epitaxially grown semiconductor pattern.

Each of the channel structures 15 may further include at least one of a memory layer 15A surrounding a sidewall of the channel layer 15B or an insulating core 15C in the channel layer 15B. The channel layer 15B may include a semiconductor material such as silicon or germanium. The memory layer 15A may include a blocking layer, a data storage layer, a tunneling layer, or combinations thereof. The insulating core 15C may include an insulating material such as an oxide, a nitride, or an air gap.

The source contact structures 16 may extend through the gate structure 14 and may be connected to the cell region 13_1 of the source structure 13. The source contact structures 16 may extend in the first direction I and may be spaced apart from one another in the second direction II. Each of the source contact structures 16 may have a line shape.

Each of the source contact structures 16 may include a source contact plug 16A. The source contact plug 16A may extend through the gate structure 14 and may be connected to the cell region 13_1 of the source structure 13 or the connection region 13_2. For example, the source contact plug 16A may extend through the gate structure 14 and may be connected to the cell region 13_1 of the source structure 13 or the first source layer 13A of the connection region 13_2. The source contact plug 16A may include polysilicon or metal.

Each of the source contact structures 16 may further include a first insulating spacer 16B, a second insulating spacer 16C, or a combination thereof. The second insulating spacer 16C may surround a sidewall of the source contact plug 16A. For example, the second insulating spacer 16C may be positioned between the source contact plug 16A and the gate structure 14, between the source contact plug 16A and the second source layer 13B, and between the source contact plug 16A and the third source layer 13F. The first insulating spacer 16B may surround a portion of a sidewall of the second insulating spacer 16C. For example, the first insulating spacer 16B may be positioned between the second insulating spacer 16C and the second source layer 13B and between the second insulating spacer 16C and the third source layer 13F. The first insulating spacer 16B or the second insulating spacer 16C may include an insulating material such as an oxide, a nitride, or an air gap.

Figure 1E:
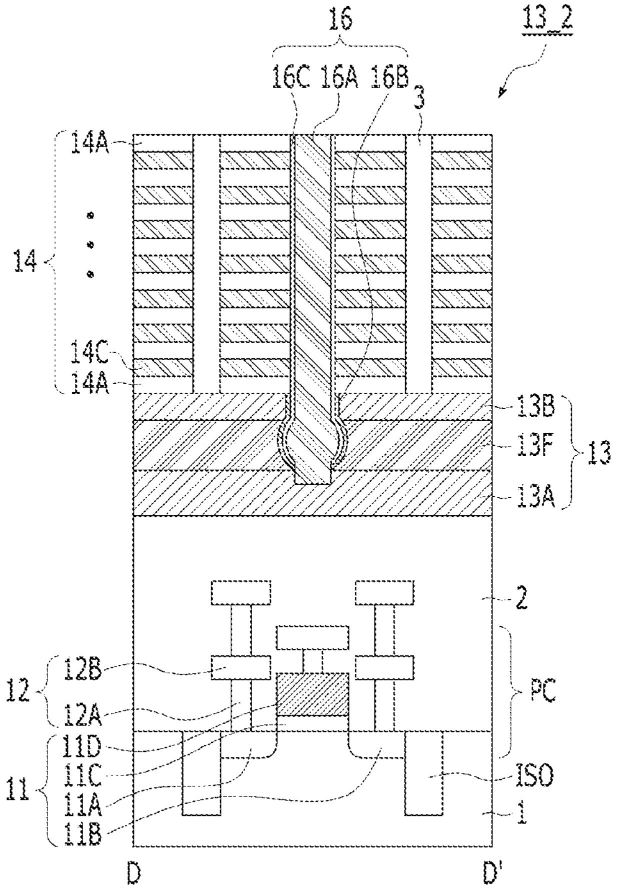

Referring to FIGS. 1A and 1E, the semiconductor device may include the source structure 13, the gate structure 14, the source contact structures 16, or combinations thereof. The semiconductor device may further include the substrate 1, the inter-layer dielectric layer 2, the peripheral circuit PC, the interconnection structure 12, the isolation layer ISO, supports 3, contact plugs 4, or combinations thereof.

The gate structure 14 may be positioned on the source structure 13. The gate structure 14 may be positioned on the connection region 13_2 of the source structure 13. The gate structure 14 may extend in the first direction I. For example, the gate structure 14 may extend from the cell region 13_1 of the source structure 13 to the connection region 13_2. The gate structure 14 may include a step structure. For example, the gate structure 14 positioned on the connection region 13_2 of the source structure 13 may include the step structure. The step structure may be for exposing each of the conductive layers 14C included in the gate structure 14.

The gate structure 14 may include the insulating layers 14A and the conductive layers 14C that are alternately stacked on one another. A portion of the gate structure 14 may include the insulating layers 14A and sacrificial layers 14B that are alternately stacked on one another. For example, a portion of the gate structure 14 surrounded by the supports 3 may include the insulating layers 14A and the sacrificial layers 14B that are alternately stacked on one another.

The source contact structures 16 may extend through the gate structure 14 and may be connected to the connection region 13_2 of the source structure 13. Each of the source contact structures 16 may extend in the first direction I. For example, each of the source contact structures 16 may extend from the cell region 13_1 of the source structure 13 to the connection region 13_2.

The supports 3 may extend through the gate structure 14 and may be positioned on the source structure 13. For example, the supports 3 may be positioned on the connection region 13_2 of the source structure 13. Each of the supports 3 may have a plug shape. Each of the supports 3 may have a circular shape, an elliptical shape, or a polygonal shape in a plan view. In addition, each of the supports 3 may have a shape extending in the first direction I or the second direction II intersecting the first direction I or may have a U-shape or an O-shape. The supports 3 may serve to prevent or minimize inclination of the dummy stack 14_1 or the gate structure 14 in the process of replacing the sacrificial layer 14B with the conductive layer 14C. Each of the supports 3 may include an insulating material such as an oxide, a nitride, or an air gap.

The contact plugs 4 may be positioned on the connection region 13_2 of the source structure 13. Each of the contact plugs 4 may be connected to the conductive layer 14C of the gate structure 14 exposed through the step structure. For example, each of the contact plugs 4 may be connected to a word line, a drain selection line, or a source selection line. Each of the contact plugs 4 may be connected to the peripheral circuit PC. For example, each of the contact plugs 4 may be connected to the transistor 11. Each of the contact plugs 4 may include a conductive material such as tungsten.

According to the structure described above, the first contact structure 18, the second contact structure 19 and the discharge interconnection structure 17 may be used as a path for emitting charges accumulated in the source structure 13 during a manufacturing process. The charges accumulated in the source structure 13 may be emitted from the dummy region 13_3 of the source structure 13.

In the first dummy region 13_3A, the first contact structure 18 may be directly connected to the discharge interconnection structure 17 positioned below the source structure 13. The second contact structure 19 may extend from the second dummy region 13_3B to the first dummy region 13_3A and may be electrically connected to the discharge interconnection structure 17 through the first contact structure 18. Accordingly, even though the first contact structure 18 is not present in the second dummy region 13_3B, the second contact structure 19 having a different shape from the first contact structure 18 may be positioned in the second dummy region 13_3B, which makes it possible to reduce the resistance of the charge emission path.

Figure 2A:
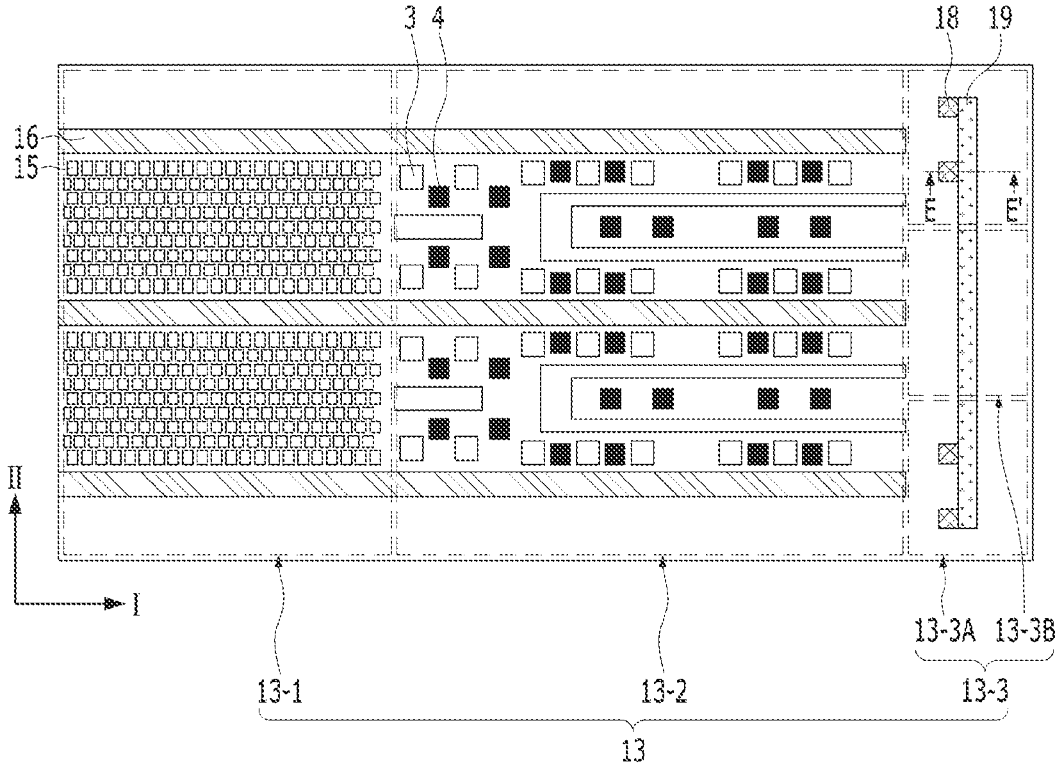
FIGS. 2A and 2B are diagrams illustrating a structure of a semiconductor device in accordance with an embodiment of the present disclosure.
Figure 2B:
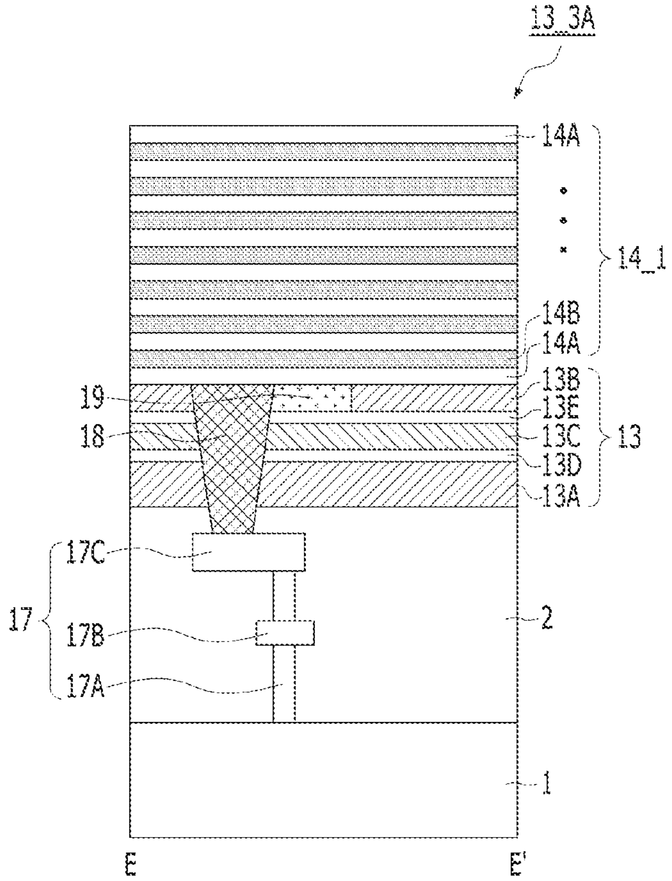

FIGS. 2A to 2B are diagrams illustrating a structure of a semiconductor device in accordance with an embodiment. FIG. 2A is a plan view illustrating the semiconductor device, and FIG. 2B may be a cross-sectional view illustrating the semiconductor device taken along an E-E' line of FIG. 2A. Hereinafter, detailed descriptions of overlapping configurations will be omitted.

Referring to FIGS. 2A and 2B, the semiconductor device may include a source structure 13, first contact structures 18, a second contact structure 19, or combinations thereof. The semiconductor device may further include a substrate 1, an inter-layer dielectric layer 2, supports 3, contact plugs 4, channel structures 15, source contact structures 16, a discharge interconnection structure 17, a dummy stack 14_1, or combinations thereof.

The source structure 13 may include a cell region 13_1, a connection region 13_2, a dummy region 13_3, or combinations thereof. The dummy region 13_3 may be positioned to be spaced apart from the cell region 13_1 in a first direction I. The connection region 13_2 may be positioned between the cell region 13_1 and the dummy region 13_3. The dummy region 13_3 may include a first dummy region 13_3A in which the first contact structures 18 or the second contact structure 19 are or is positioned and a second dummy region 13_313 in which the second contact structure 19 is positioned.

The first contact structures 18 may be positioned in the first dummy region 13_3A. The first contact structures 18 may be adjacent to the second contact structure 19 in the first direction I. The first contact structures 18 may be positioned to contact the second contact structure 19 in the first direction I. The discharge interconnection structure 17 may be positioned below each of the first contact structures 18. Each of the first contact structures 18 may be directly connected to the discharge interconnection structure 17. Each of the first contact structures 18 may extend through the source structure 13.

The second contact structure 19 may have a line shape extending from the second dummy region 13_313 to the first dummy region 13_3A in a second direction II intersecting the first direction I. The second contact structure 19 may be electrically connected to the discharge interconnection structure 17 through the first contact structures 18. The second contact structure 19 may be electrically connected to the first contact structures 18 through the source structure 13. The first contact structures 18 or the second contact structure 19 may include a material having lower resistivity than the source structure 13. For example, the first contact structures 18 or the second contact structure 19 may include a metal material such as tungsten.

According to the structure described above, the second contact structure 19 may be positioned to contact the first contact structures 18. When the second contact structure 19 and the first contact structures 18 are spaced apart from each other, charges moving from the second contact structure 19 to the first contact structures 18 pass the source structure 13 having relatively high resistivity. Accordingly, as the first contact structures 18 and the second contact structure 19 are positioned to contact each other, the charges may more effectively move to the first contact structures 18 than when the charges move to the first contact structures 18 via the source structure 13.

FIGS. 3A to 3D, 4A to 4D, 5A to 5D, 6A, 6B, and 7 are diagrams illustrating a manufacturing method of a semiconductor device in accordance with an embodiment of the present disclosure. FIGS. 3A, 4A, 5A and 6A may be plan views illustrating the semiconductor device, FIGS. 3B, 4B and 5B may be cross-sectional views illustrating a first dummy region of a source structure, FIGS. 3C, 4C, and 5C may be cross-sectional views illustrating a second dummy region of the source structure, and FIGS. 3D, 4D, 5D, 6B, and 7 may be cross-sectional views illustrating a cell region of the source structure.

Referring to FIGS. 3A to 3D, a source structure 53 may be formed. The source structure 53 may include a cell region 53_1, a dummy region 53_3, or a combination thereof. The dummy region 53_3 may be adjacent to the cell region 53_1 in a first direction I. The source structure 53 may further include a connection region 53_2. The connection region 53_2 may be positioned between the cell region 53_1 and the dummy region 53_3, and the cell region 53_1 and the dummy region 53_3 may be connected to each other by the connection region 53_2. The dummy region 53_3 may include a first dummy region 53_3A and a second dummy region 53_36. The first dummy region 53_3A and the second dummy region 53_36 may be adjacent to each other in a second direction II intersecting the first direction I. For example, the second dummy region 53_36 may be positioned between the first dummy regions 53_3A.

The source structure 53 may include a first source layer 53A, a first passivation layer 53D, a source sacrificial layer 53C, a second passivation layer 53E, a second source layer 53B, or combinations thereof. The source sacrificial layer 53C may serve to secure a space for forming a third source layer in a subsequent process. The source structure 53 may include a conductive material such as polysilicon or metal. The first passivation layer 53D or the second passivation layer 53E may include an insulating material such as an oxide or a nitride.

For reference, before the source structure 53 is formed, a peripheral circuit PC, an interconnection structure 52, a discharge interconnection structure 57, or combinations thereof may be formed.

Figure 3A:
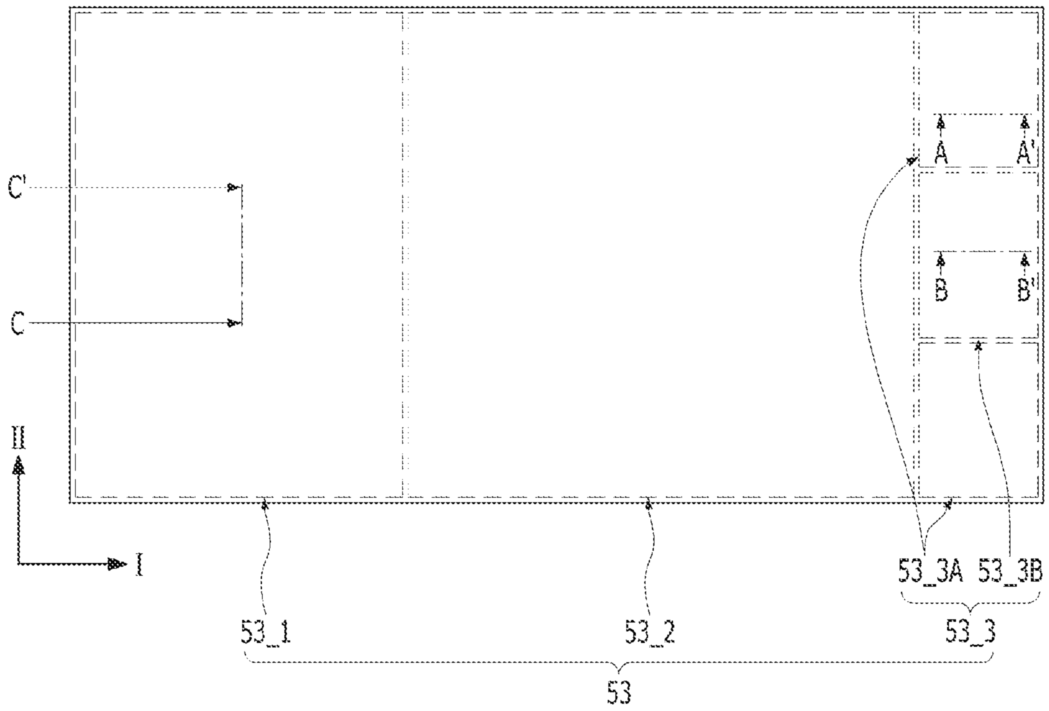
FIGS. 3A to 3D, 4A to 4D, 5A to 5D, 6A, 6B, and 7 are diagrams illustrating a manufacturing method of a semiconductor device in accordance with an embodiment of the present disclosure.
Figure 3B:
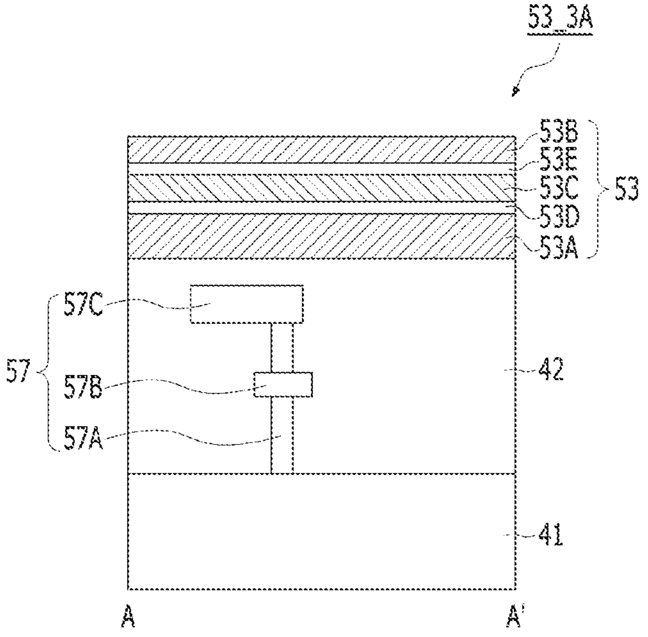

Referring to FIG. 3B, the discharge interconnection structure 57 may be formed on a substrate 41. The discharge interconnection structure 57 may include contact plugs 57A, a wiring 57B, or a connection pad 57C. The discharge interconnection structure 57 may include a conductive material such as tungsten.

Figure 3C:
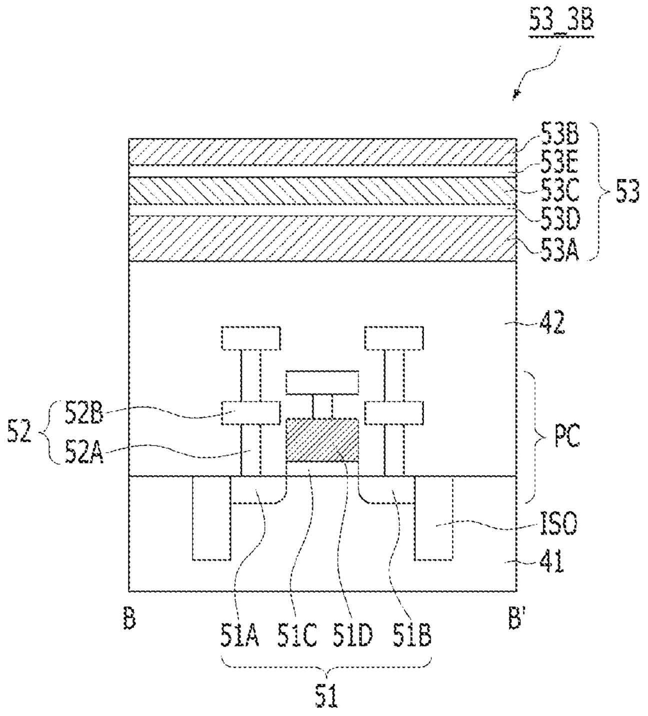
Figure 3D:
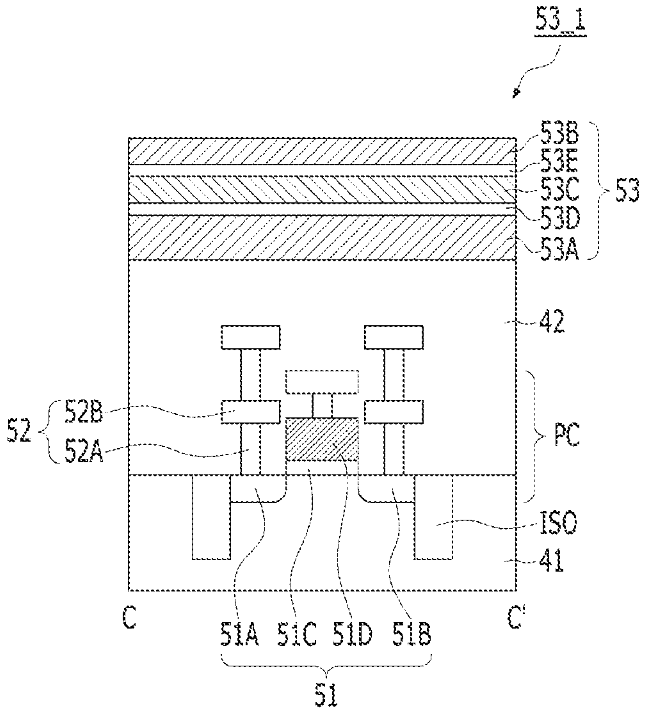

Referring to FIGS. 3C and 3D, the peripheral circuit PC or the interconnection structure 52 may be formed on the substrate 41. An isolation layer ISO may be formed in the substrate 41, and an active region may be defined by the isolation layer ISO. The peripheral circuit PC may include a transistor 51, a capacitor, or a resistor. For example, the transistor 51 may include a first junction 51A, a second junction 51B, a gate insulating layer 51C or a gate electrode 51D. The gate insulating layer 51C and the isolation layer ISO may include an insulating material such as an oxide or a nitride. The interconnection structure 52 may include contact plugs 52A or wirings 52B. The interconnection structure 52 may include a conductive material such as tungsten.

The discharge interconnection structure 57, the peripheral circuit PC or the interconnection structure 52 may be formed in an inter-layer dielectric layer 42. The source structure 53 may be formed on the inter-layer dielectric layer 42. Accordingly, the discharge interconnection structure 57 may be positioned below the first dummy region 53_3A of the source structure 53, the peripheral circuit PC or the interconnection structure 52 may be positioned below the second dummy region 53_3B, and the peripheral circuit PC or the interconnection structure 52 may be positioned below the cell region 53_1.

Referring to FIGS. 4A to 4D, a first contact structure 58 extending through the source structure 53 may be formed. For example, the first contact structure 58 extending through the first dummy region 53_3A of the source structure 53 may be formed. First, a first trench T1 passing through the source structure 53 may be formed. The first trench T1 is for forming the first contact structure 58 directly connected to the discharge interconnection structure 57. Accordingly, the first trench T1 may be positioned to overlap the discharge interconnection structure 57 in a stacking direction and may be formed in the first dummy region 53_3A in which the peripheral circuit PC or the interconnection structure 52 is not positioned. For example, the first trench T1 passing through a second source layer 53B, a second passivation layer 53E, a source sacrificial layer 53C, a first passivation layer 53D and a first source layer 53A may be formed. The first trench T1 may have a first depth D1 and may expose the discharge interconnection structure 57. Subsequently, the first contact structure 58 may be formed in the first trench T1. Accordingly, the first contact structure 58 directly connected to the discharge interconnection structure 57 may be formed. The first contact structure 58 may have a depth corresponding to the first trench T1 and may have the first depth D1.

One or more first contact structures 58 may be formed in the first dummy region 53_3A. The one or more first contact structures 58 may be formed to be spaced apart from one another in the first direction I or the second direction II. Each of the first contact structures 58 may include a material having lower resistivity than the source structure 53. For example, the source structure 53 may include polysilicon, and the first contact structure 58 may include a metal material such as tungsten.

Subsequently, a second contact structure 59 may be formed in the source structure 53. For example, the second contact structure 59 may be formed in the second dummy region 53_36 of the source structure 53. First, a second trench T2 passing through a portion of the source structure 53 may be formed. The second trench T2 is for forming the second contact structure 59 indirectly connected to the discharge interconnection structure 57. The second trench T2 may have a second depth D2 different from the first depth D1. For example, the second depth D2 may be smaller than the first depth D1. Because the second trench T2 may have a smaller depth than the first trench T1, the second trench T2 does not pass through the source structure 53. Accordingly, even though the second trench T2 is formed in the second dummy region 53_313, the interconnection structure 52 or the peripheral circuit PC is not exposed by the second trench T2. In other words, even though the second contact structure 59 is formed in the second dummy region 53_313, the second contact structure 59 and the interconnection structure 52 may be electrically isolated from each other. Accordingly, the second trench T2 may be positioned to overlap the interconnection structure 52 in the stacking direction and may be formed in the second dummy region 53_313 in which the interconnection structure 52 or the peripheral circuit PC is formed. In addition, the second trench T2 may extend to the first dummy region 53_3A. Subsequently, the second contact structure 59 may be formed in the second trench T2. The second contact structure 59 may have a depth corresponding to the second trench T2 and may have the second depth D2. The second contact structure 59 may include a material having lower resistivity than the source structure 53. For example, the source structure 53 may include polysilicon, and the second contact structure 59 may include a metal material such as tungsten.

The second contact structure 59 may be formed to be spaced apart from the first contact structure 58 in the first direction I. The second contact structure 59 may be formed to be farther from the cell region 53_1 than the first contact structure 58. In other words, the first contact structure 58 may be positioned closer to the cell region 53_1 than the second contact structure 59. The second contact structure 59 may extend in the second direction II.

Before the second contact structure 59 is formed, the first contact structure 58 may be formed. When the second trench T2 for forming the second contact structure 59 is formed, charges may flow into the source structure 53 through the second trench T2. Accordingly, a passage for emitting the charges is required. The first contact structure 58 may be used as the passage for emitting accumulated charges when the second trench T2 is formed. However, the present disclosure is not limited thereto, and the first contact structure 58 and the second contact structure 59 may be simultaneously formed, or the first contact structure 58 may be formed after the second contact structure 59 is formed.

Figure 4A:
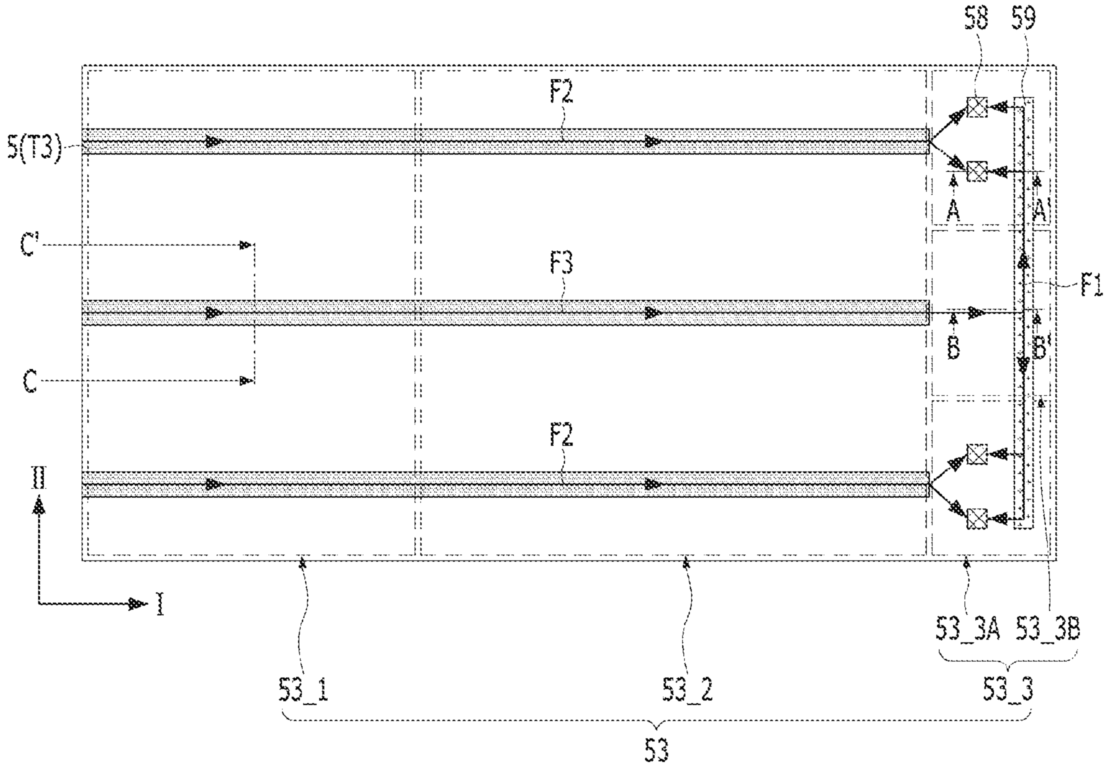
Figure 4B:
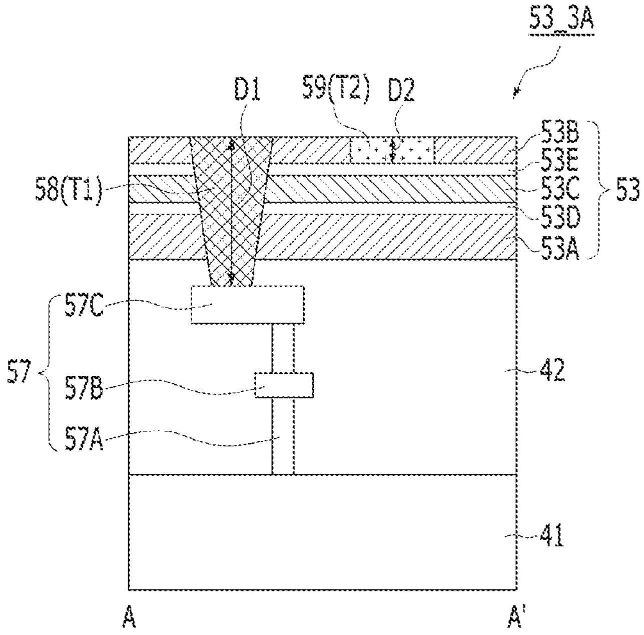
Figure 4C:
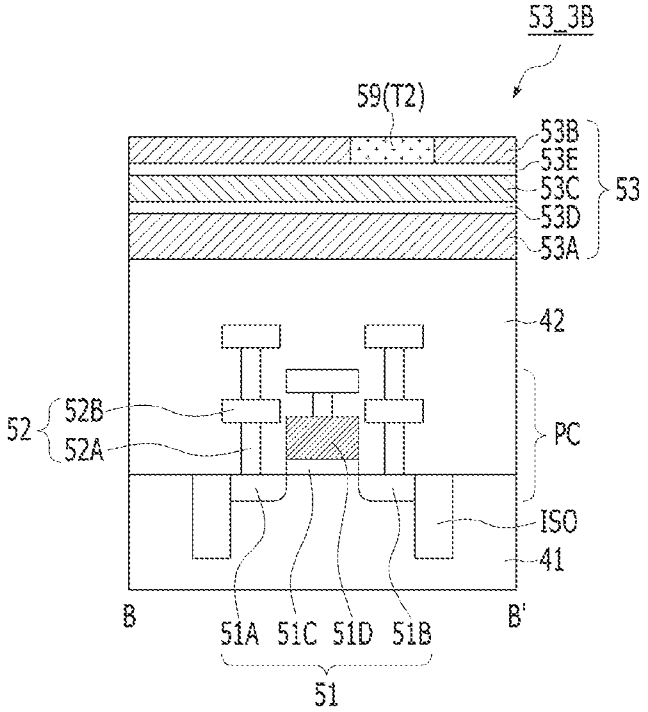
Figure 4D:
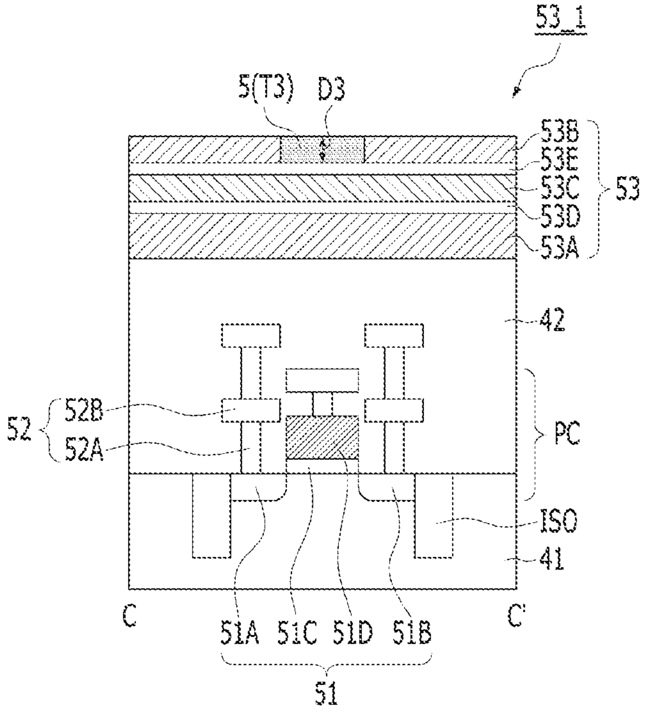

Referring to FIG. 4A, the charges accumulated in the process of forming the second trench T2 may move to the first contact structure 58 along a first path F1. For example, the charges may move to the first dummy region 53_3A along the first path F1 and may move to the first contact structure 58 including a material having lower resistivity than the source structure 53. Accordingly, the charges may be emitted through the first contact structure 58 and the discharge interconnection structure 57 connected to the first contact structure 58.

A landing pad 5 may be formed in the source structure 53. For example, the landing pad 5 may be formed in the cell region 53_1 of the source structure 53. First, a third trench T3 passing through a portion of the source structure 53 may be formed. The third trench T3 is for forming the landing pad 5 indirectly connected to the discharge interconnection structure 57. The third trench T3 may have a third depth D3 different from the first depth D1 or the second depth D2. For example, the third depth D3 may be smaller than the first depth D1 and may be substantially equal to the second depth D2. The third trench T3 may extend to the connection region 53_2 of the source structure 53.

One or more landing pads 5 may be formed in the cell region 53_1 of the source structure 53. The landing pads 5 may be formed to be spaced apart from one another in the second direction II. Each of the landing pads 5 may be formed to be spaced apart from the first contact structure 58 and the second contact structure 59. The landing pad 5 may extend in the first direction I. For example, the landing pad 5 may extend from the cell region 53_1 to the connection region 53_2 of the source structure 53. The landing pad 5 may include a material having lower resistivity than the source structure 53. For example, the source structure 53 may include polysilicon, and the landing pad 5 may include a metal material such as tungsten.

When the third trench T3 is formed, the second trench T2 may be formed. However, the present disclosure is not limited thereto, and the third trench T3 may be formed before the second trench T2 is formed, or the third trench T3 may be formed after the second trench T2 is formed. For example, the second contact structure 59 may be formed when the landing pad 5 is formed. Accordingly, the second contact structure 59 may be formed without adding a separate process.

When the third trench T3 is formed for forming the landing pad 5, the charges may be accumulated in the source structure 53. Accordingly, the charges accumulated in the source structure 53 may be emitted through the first contact structure 58 or the second contact structure 59.

Referring to FIG. 4A, the charges accumulated in the process of forming the third trench T3 may move to the first contact structure 58 or the second contact structure 59 through the first path F1, a second path F2, a third path F3, or combinations thereof. As an example, the charges may move from the cell region 53_1 to the connection region 53_2 along the second path F2 and may move to the first contact structure 58 of the first dummy region 53_3A. As another example, the charges may move from the cell region 53_1 to the connection region 53_2 along the third path F3 and may move to the second contact structure 59 of the second dummy region 53_313. Subsequently, the charges may move to the first contact structure 58 of the first dummy region 53_3A along the first path F1. In this case, the first contact structure 58 and the second contact structure 59 may be used as passages for emitting the charges accumulated in the source structure 53, and thus each be a discharge contact structure.

Referring to FIGS. 5A to 5D, a stack 64_1 may be formed on the source structure 53. For example, the stack 64_1 may be formed on the cell region 53_1, the connection region 53_2 and the dummy region 53_3 of the source structure 53. The stack 64_1 may include first material layers 64A and second material layers 64B that are alternately stacked on one another. The first material layers 64A may include an insulating material such as an oxide, and the second material layers 64B may include a sacrificial material such as a nitride or a conductive material such as polysilicon, tungsten, or molybdenum. A portion of the stack 64_1 formed on the dummy region 53_3 of the source structure 53 may be a dummy stack.

Subsequently, at least one first opening OP1 passing through the stack 64_1 may be formed. The first opening OP1 may serve to form a channel structure. The first opening OP1 may expose the cell region 53_1 of the source structure 53. When the first opening OP1 is formed, plasma may be used. The stack 64_1 may be etched with ions by the plasma. In this case, positive charges may be accumulated in peripheral layers of the stack 64_1 and the source structure 53. Because arcing occurs when the positive charges are accumulated, a passage for emitting the accumulated charges is required.

Figure 5A:
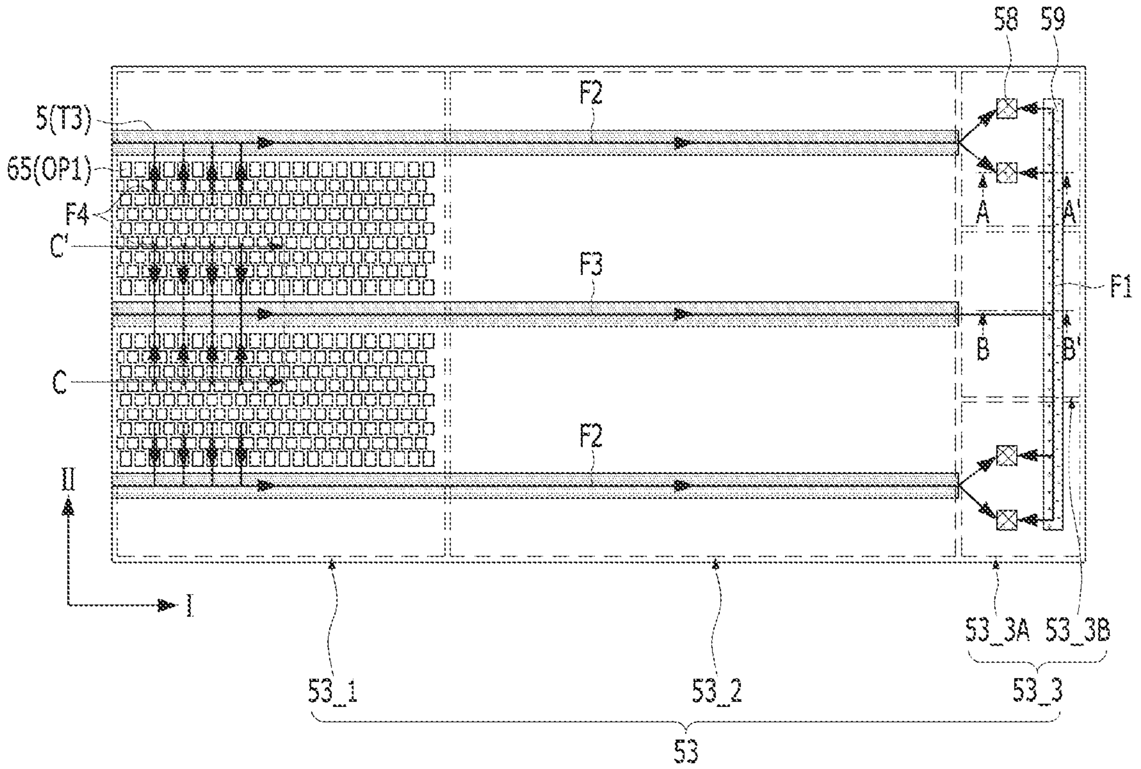
Figure 5B:
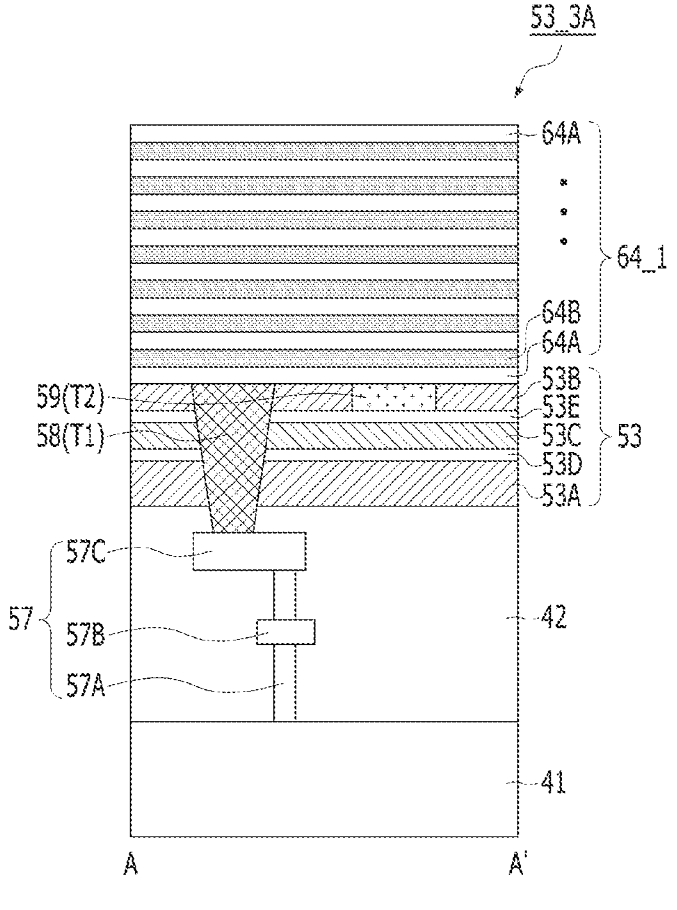
Figure 5C:
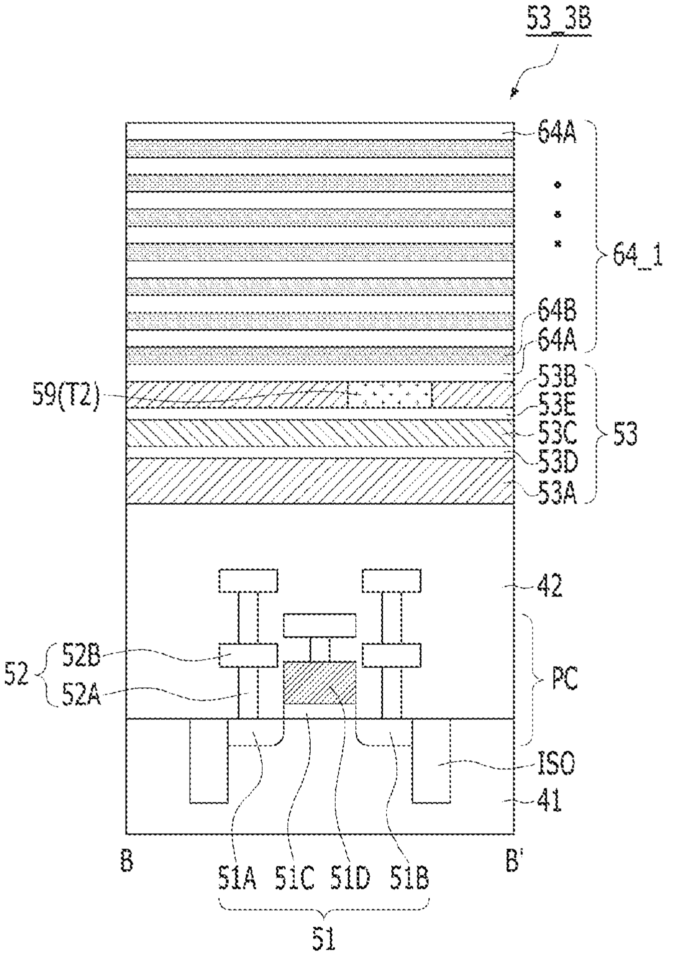
Figure 5D:
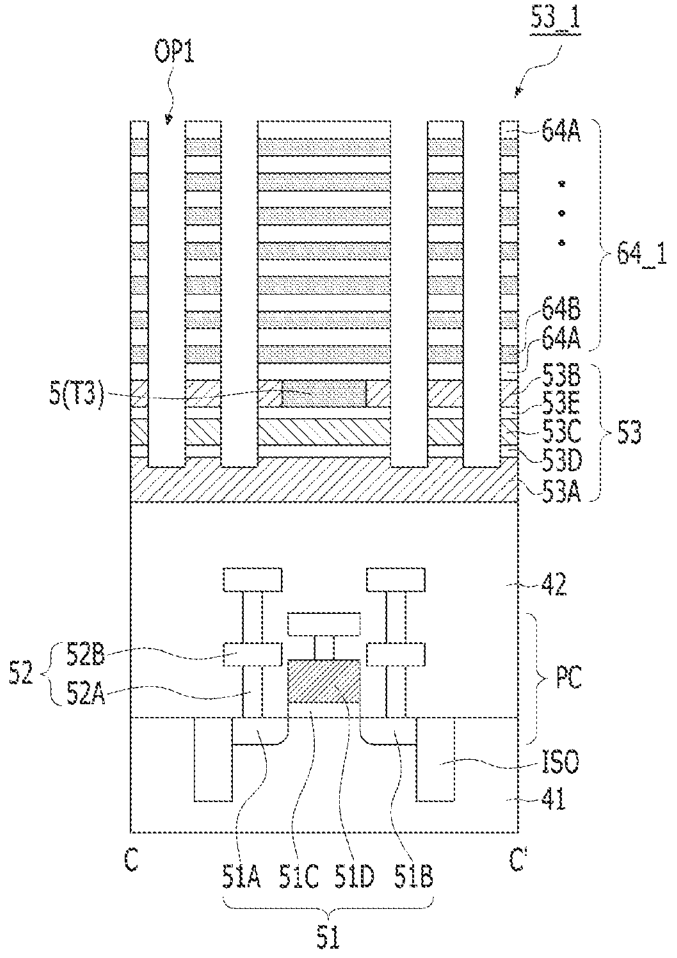

Referring to FIG. 5A, the charges accumulated in the process of forming the first opening OP1 may move to the first contact structure 58 or the second contact structure 59 through the first path F1, the second path F2, the third path F3, a fourth path F4, or combinations thereof. As an example, the charges may move from the cell region 53_1 of the source structure 53 to the landing pad 5 along the fourth path F4, and move from the cell region 53_1 to the connection region 53_2 along the second path F2. Subsequently, the charges may move to the first contact structure 58 of the first dummy region 53_3A positioned close to the cell region 53_1. As another example, the charges may move to the landing pad 5 along the fourth path F4, and move from the cell region 53_1 to the connection region 53_2 along the third path F3. Subsequently, the charges may move to the second contact structure 59 of the second dummy region 53_36, and then move to the first contact structure 58 of the first dummy region 53_3A along the first path F1.

Figure 6A:
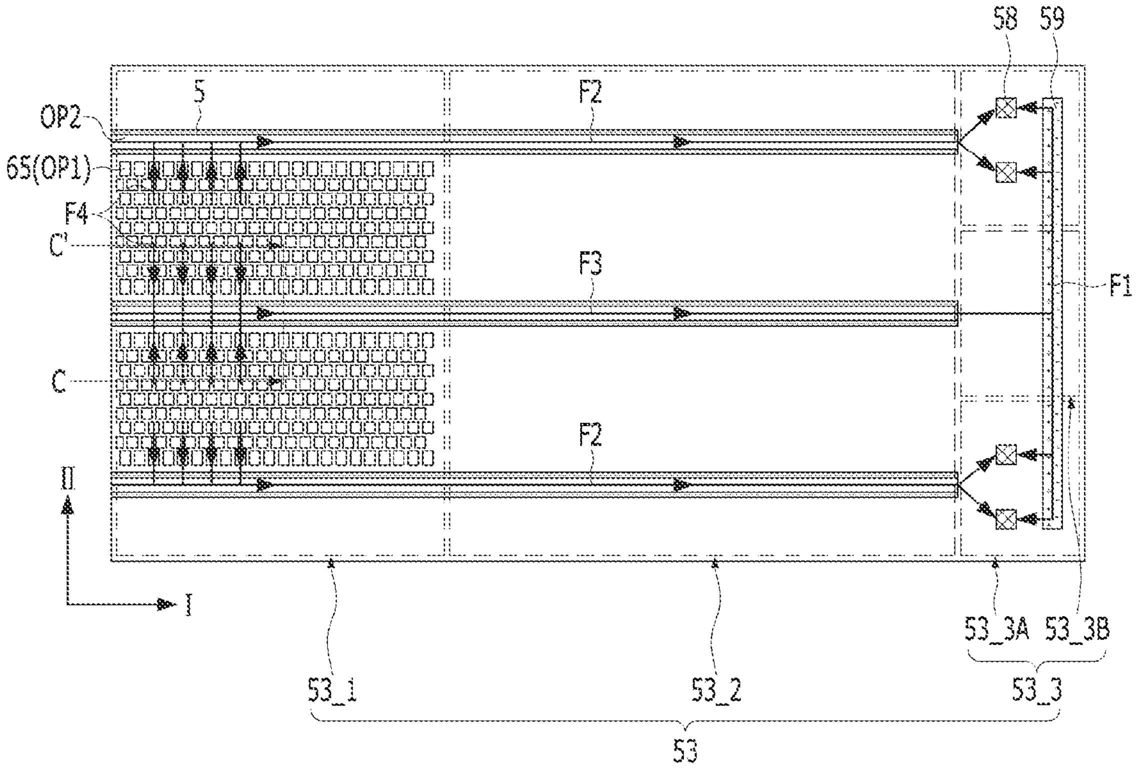
Figure 6B:
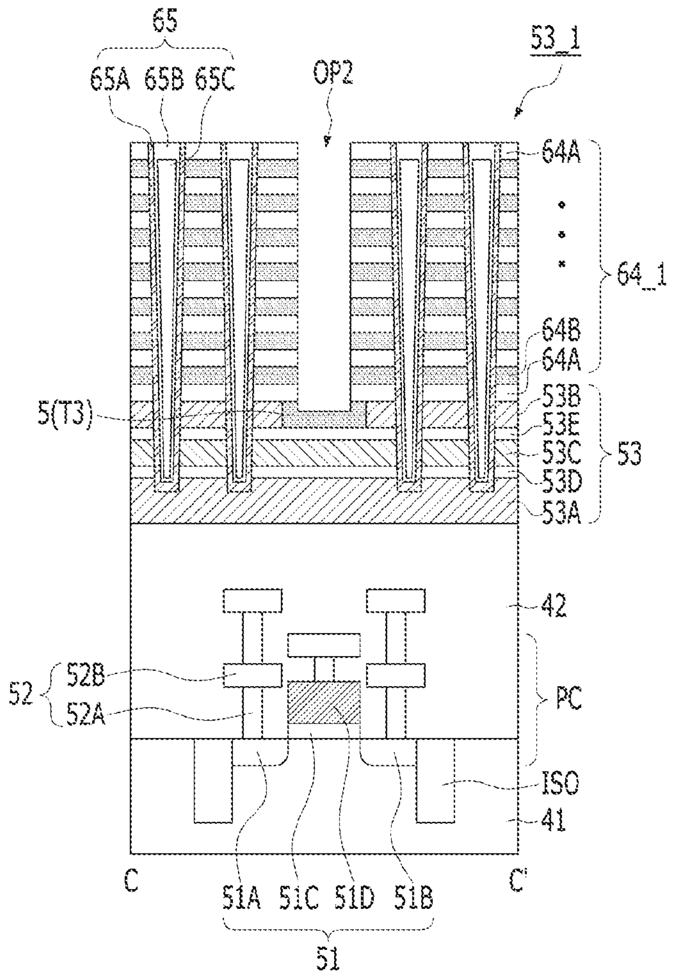

Referring to FIGS. 6A and 6B, a channel structure 65 may be formed. For example, the channel structure 65 may be formed in the first opening OP1. The channel structure 65 may be connected to the cell region 53_1 of the source structure 53. The channel structure may include a channel layer 65B. The channel structure 65 may further include at least one of a memory layer 65A, which surrounds a sidewall of the channel layer 65B, and an insulating core 65C, which is in the channel layer 65B. The channel layer 65B may include a semiconductor material such as silicon or germanium. The memory layer 65A may include a blocking layer, a data storage layer, a tunneling layer, or combinations thereof. The insulating core 65C may include an insulating material such as an oxide, a nitride, or an air gap.

Although not illustrated in the drawings, a step structure may be formed by patterning the stack 64_1. The step structure may be positioned on the connection region 53_2 of the source structure 53. For example, the step structure may be formed to expose each of the second material layers 64B. In addition, supports extending through the stack 64_1 may be formed. The supports may be positioned on the connection region 53_2 of the source structure 53. The supports may serve to prevent or minimize the inclination of the stack 64_1 in the process of replacing the second material layers 64B of the stack 64_1 with third material layers (not illustrated). The supports may include an insulating material such as an oxide, a nitride, or an air gap.

Subsequently, a second opening OP2 passing through the stack 64_1 may be formed. The landing pad 5 may be exposed through the second opening OP2 by etching the stack 64_1. The landing pad 5 may be used as an etch stop layer when the second opening OP2 is formed. Accordingly, when the second opening OP2 is formed, a portion of the landing pad 5 may be etched.

Plasma may be used to etch the stack 64_1, and in this case, positive charges may be accumulated in the stack 64_1, the source structure 53 and the like. Therefore, a passage for emitting the charges is required. According to an embodiment of the present disclosure, the landing pad 5, the first contact structure 58, the second contact structure 59 and the discharge interconnection structure 57 may be used as passages for emitting the charges accumulated in the source structure 53 and the like when the second opening OP2 is formed.

Referring to FIG. 6A, the charges accumulated in the process of forming the second opening OP2 may move to the first contact structure 58 or the second contact structure 59 through the first path F1, the second path F2, the third path F3, or combinations thereof. As an example, the charges may move from the cell region 53_1 to the connection region 53_2 along the second path F2 and may move to the first contact structure 58 of the first dummy region 53_3A positioned close to the cell region 53_1. As another example, the charges may move from the cell region 53_1 to the connection region 53_2 along the third path F3 and may move to the second contact structure 59 of the second dummy region 53_36 including a material having lower resistivity than the source structure 53. Subsequently, the charges may move to the first contact structure 58 of the first dummy region 53_3A along the first path F1.

Figure 7:
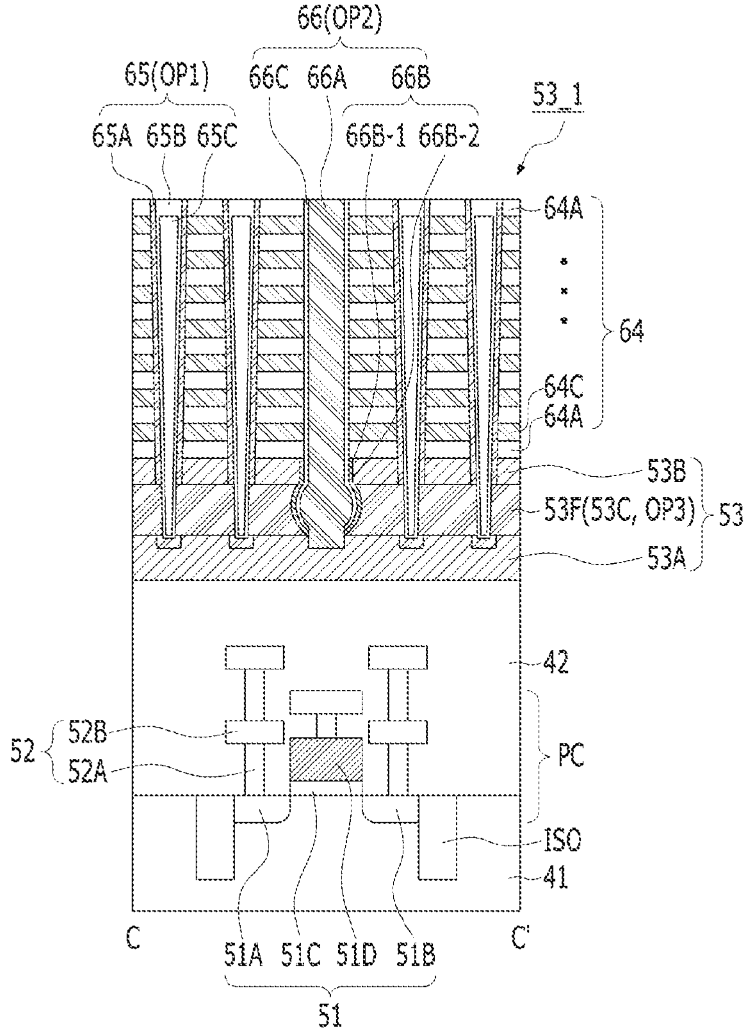

Referring to FIG. 7, a source contact structure 66 may be formed. For example, after the source sacrificial layer 53C is replaced with a third source layer 53F, the source contact structure 66 connected to the cell region 53_1 of the source structure 53 may be formed.

First, the landing pad 5 may be removed through the second opening OP2. Subsequently, a passivation layer 6613_1 may be formed on a sidewall of the second source layer 53B exposed by removing the landing pad 5. Subsequently, the second passivation layer 53E exposed on a bottom surface of the second opening OP2 may be etched to expose the source sacrificial layer 53C. Subsequently, the source sacrificial layer 53C may be removed to form a third opening OP3. Subsequently, the memory layer 65A exposed through the third opening OP3 may be etched to expose the channel layer 65B. In the process of etching the memory layer 65A, a portion of the first passivation layer 53D, a portion of the second passivation layer 53E, or a portion of the passivation layer 66B_1 may be removed.

Subsequently, after a conductive layer is formed in the second opening OP2 and the third opening OP3, a portion of the conductive layer formed in the second opening OP2 may be removed. Accordingly, a portion of the conductive layer remaining in the third opening OP3 may be defined as the third source layer 53F. Subsequently, a passivation layer 66B_2 may be formed on a sidewall of the third source layer 53F and a surface of the first source layer 53A, which are exposed through the third opening OP3. For example, the passivation layer 66B_2 may be formed by oxidizing a bottom surface of the second opening OP2. The passivation layer 66B_2 may be defined as a first insulating spacer 66B together with the passivation layer 66B_1. Subsequently, a second insulating spacer 66C may be formed on an inner surface of the second opening OP2. Subsequently, the first source layer 53A may be exposed by etching a bottom surface of the first insulating spacer 66B and a bottom surface of the second insulating spacer 66C. Subsequently, a source contact plug 66A may be formed in the second opening OP2.

Subsequently, the stack 64_1 formed on the cell region 53_1 of the source structure 53 may be replaced with a gate structure 64. The second material layers 64B of the stack 64_1 may be replaced with third material layers 64C. For example, the second material layers 64B may be removed through the second opening OP2 and may be replaced with the third material layers 64C. When the first material layers 64A include an insulating material and the second material layers 64B include a sacrificial material, the second material layers 64B may be replaced with conductive layers. The conductive layers may include a conductive material such as polysilicon, tungsten, or molybdenum. When the first material layers 64A include an insulating material and the second material layers 64B include a conductive material, the second material layers 64B may be silicided. Accordingly, the gate structure 64 including the first material layers 64A and the third material layers 64C that are alternately stacked on one another may be formed.

For reference, some of the second material layers 64B might not be replaced with the third material layers 64C. For example, some regions of the second material layers 64B positioned on the connection region 53_2 of the source structure 53 might not be replaced with the third material layers 64C. In this case, a portion of the gate structure 64 may include the first material layers 64A and the second material layers 64B that are alternately stacked on one another. The stack 64_1 formed on the dummy region 53_3 of the source structure 53 might not be replaced with the gate structure 64. Among the stacks 64_1 formed on the dummy region 53_3, the stack 64_1 that is not replaced with the gate structure 64 may be a dummy stack.

According to the manufacturing method described above, a passage for emitting the charges accumulated in the source structure 53 and the like through the landing pad 5, the first contact structure 58, the second contact structure 59 or the discharge interconnection structure 57 may be provided. For example, the charges accumulated in the process of forming the second trench T2 or the third trench T3 may be emitted through the first contact structure 58, the second contact structure 59, the discharge interconnection structure 57, or combinations thereof. The charges accumulated in the process of forming the first opening OP1 or the second opening OP2 may be emitted through the landing pad 5, the first contact structure 58, the second contact structure 59, the discharge interconnection structure 57, or combinations thereof.

In addition, when the landing pad 5 is formed in the cell region 53_1 of the source structure 53, the second contact structure 59 may be formed in the dummy region 53_3, and thus the second contact structure 59 may be formed in the dummy region 53_3 without adding a separate process.

An embodiment of the present disclosure is directed to a semiconductor device having a stable structure and improved characteristics, and a manufacturing method thereof.

According to an embodiment of the present disclosure, it is possible to provide a semiconductor device having a stable structure and improved reliability.

While the present disclosure has been illustrated and described with respect to specific embodiment, the disclosed embodiment is provided for the description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. A semiconductor device comprising:
- a discharge interconnection structure;
- a source structure on the discharge interconnection structure;
- a first discharge contact structure extending through the source structure electrically connected to the discharge interconnection structure, the first discharge contact structure having a first depth; and
- a second discharge contact structure positioned in the source structure, the second discharge contact structure having a second depth different from the first depth;
- wherein the second discharge contact structure is spaced apart from the first discharge contact structure in a first direction; and
- wherein the second discharge contact structure extends in a second direction non-parallel to the first direction and has an elongated shape.

2. The semiconductor device of claim 1, wherein the second depth is smaller than the first depth.

3. The semiconductor device of claim 1, wherein the second discharge contact structure is electrically connected to the discharge interconnection structure through the first discharge contact structure.

4. The semiconductor device of claim 1, wherein the source structure includes a cell region and a dummy region, and the first discharge contact structure and the second discharge contact structure are positioned in the dummy region.

5. The semiconductor device of claim 4, wherein the dummy region includes a first dummy region in which the first discharge contact structure is positioned and a second dummy region in which the second discharge contact structure is positioned, and the second discharge contact structure extends into the first dummy region.

6. The semiconductor device of claim 5, wherein the first discharge contact structure is spaced apart from the second dummy region.

7. The semiconductor device of claim 5, further comprising:

a peripheral circuit positioned below the source structure; and an interconnection structure positioned below the second dummy region and electrically connected to the peripheral circuit.

8. The semiconductor device of claim 7, wherein the first discharge contact structure does not overlap the interconnection structure in a stacking direction, and the second discharge contact structure overlaps the interconnection structure in the stacking direction.

9. The semiconductor device of claim 4, further comprising:

a gate structure positioned on the cell region of the source structure;

a channel structure extending through the gate structure and connected to the cell region of the source structure; and a dummy stack positioned on the dummy region of the source structure.

10. The semiconductor device of claim 4, wherein the cell region and the dummy region are adjacent to each other in the first direction, the first discharge contact structure and the second discharge contact structure are adjacent to each other in the first direction, and the second discharge contact structure extends in the second direction different from the first direction.

11. The semiconductor device of claim 4, wherein the first discharge contact structure is positioned closer to the cell region than the second discharge contact structure.

12. The semiconductor device of claim 1, wherein at least one of the first discharge contact structure and the second discharge contact structure includes a material having lower resistivity than the source structure.

13. A semiconductor device comprising:

a source structure including a cell region, a first of two first dummy regions, and a second dummy region positioned between the first of the two first dummy regions and a second of the two first dummy regions;

a gate structure positioned on the cell region of the source structure;

a dummy stack positioned in the two first dummy regions and the second dummy region of the source structure;

first contact structures, each positioned in one of the two first dummy regions of the source structure, the first contact structures having a first depth; and a second contact structure positioned in the second dummy region of the source structure and extending into the first of the two first dummy regions and into the second of the two first dummy regions of the source structure, the second contact structure having a second depth smaller than the first depth, and the second contact structure electrically connected to the first contact structures through the source structure.

14. The semiconductor device of claim 13, further comprising:

a substrate positioned below the source structure; and a discharge interconnection structure positioned between the substrate and the source structure, the discharge interconnection structure electrically connecting the first contact structure to the substrate.

15. The semiconductor device of claim 14, wherein the second contact structure is electrically connected to the discharge interconnection structure through the first contact structure.

16. The semiconductor device of claim 13, wherein the source structure further includes a connection region positioned between the cell region and the two first dummy regions, and between the cell region and the second dummy region, and the gate structure extends to the connection region.

17. The semiconductor device of claim 16, further comprising a channel structure passing through the gate structure and connected to the cell region of the source structure, wherein the gate structure includes a step structure positioned on the connection region of the source structure.

18. The semiconductor device of claim 13, wherein the first of the two first dummy regions is adjacent to a first end of the second dummy region and the second of the two first dummy regions is adjacent to a second end of the second dummy region wherein the second end is opposite the first end.

19. A semiconductor device comprising:

a discharge interconnection structure;

a source structure on the discharge interconnection structure;

a first discharge contact structure extending through the source structure electrically connected to the discharge interconnection structure, the first discharge contact structure at a first depth from the upper surface of the source structure; and a second discharge contact structure disposed within the source structure, the second discharge contact structure at a second depth different from the first depth from the upper surface of the source structure;

wherein the second discharge contact structure is electrically connected to the discharge interconnection structure via the first discharge contact structure; and wherein an upper surface of the first discharge contact structure and an upper surface of the second discharge contact structure are coplanar with the upper surface of the source structure.

20. The semiconductor device of claim 19, wherein the second depth is smaller than the first depth.

21. The semiconductor device of claim 19, wherein the source structure includes a second dummy region disposed between a first of two first dummy regions and a second of the two first dummy regions, wherein the first discharge contact structure is disposed in the first of the two first dummy regions, and the second discharge contact structure extends from the first of the two first dummy regions through the second dummy region and into the second of the two first dummy regions.

22. The semiconductor device of claim 21, further comprising:

a peripheral circuit positioned below the source structure; and an interconnection structure below the second dummy region and electrically connected to the peripheral circuit;

wherein the first discharge contact structure does not overlap the interconnection structure in a stacking direction, and the second discharge contact structure overlaps the interconnection structure in the stacking direction.

23. The semiconductor device of claim 19, wherein at least one of the first discharge contact structure and the second discharge contact structure includes a material having lower resistivity than the source structure.

* * * * *